(12) United States Patent
Zhang et al.

(10) Patent No.: US 10,935,588 B2
(45) Date of Patent: Mar. 2, 2021

(54) SYSTEMS AND METHODS FOR ISLANDING DETECTION

(71) Applicant: SCHNEIDER ELECTRIC SOLAR INVERTERS USA, INC., Livermore, CA (US)

(72) Inventors: Qing Zhang, Coquitlam (CA); Vincent Aulagnier, Vancouver (CA); Steven VanWerkhoven, Surrey (CA)

(73) Assignee: SCHNEIDER ELECTRIC SOLAR INVERTERS USA, INC., Livermore, CA (US)

( * ) Notice: Subject to any disclaimer, the term of this patent is extended or adjusted under 35 U.S.C. 154(b) by 160 days.

(21) Appl. No.: 15/992,551

(22) Filed: May 30, 2018

(65) Prior Publication Data

US 2018/0348288 A1 Dec. 6, 2018

Related U.S. Application Data

(60) Provisional application No. 62/513,187, filed on May 31, 2017.

(51) Int. Cl.
*G01R 31/08* (2020.01)
*H02J 3/38* (2006.01)

(52) U.S. Cl.
CPC ............ *G01R 31/086* (2013.01); *H02J 3/383* (2013.01); *H02J 3/386* (2013.01); *H02J 3/388* (2020.01)

(58) Field of Classification Search
CPC . H02J 3/388; H02J 3/386; H02J 3/383; G01R 31/086
See application file for complete search history.

(56) References Cited

U.S. PATENT DOCUMENTS

| 7,225,087 | B1 | 5/2007 | Siciliano et al. |
| 8,159,178 | B2 | 4/2012 | Serban |
| 8,258,759 | B2 | 9/2012 | Yin et al. |
| 9,124,095 | B1 * | 9/2015 | Barron .................. G01R 19/00 |

(Continued)

FOREIGN PATENT DOCUMENTS

| EP | 1764894 A1 | 3/2007 |
| WO | 2013142553 A2 | 9/2013 |

OTHER PUBLICATIONS

Jeraputra C et al: "An improved anti-islanding algorithm for utility interconnection of multiple distributed fuel cell powered generations", Applied Power Electronics Conference and Exposition, 2005. APEC 2005, Twentieth Annual IEEE Austin, TX, USA, Mar. 6-10, 2005, Piscataway, NJ, USA, IEEE, US, vol. 1, Mar. 6, 2005 (Mar. 6, 2005), pp. 103-108, Vo I. I, XP010809382, DOI: 10.1109/APEC2005.1452896, ISBN: 978-0-7803-8975-5.

(Continued)

*Primary Examiner* — Patrick Assouad
*Assistant Examiner* — Demetrius R Pretlow
(74) *Attorney, Agent, or Firm* — Lando & Anastasi, LLP (57) ABSTRACT

Electric power systems and methods are provided that detect an islanding condition. The systems and methods include components to inject a perturbation current at a power output, based upon a perturbation current signal, and receive a voltage signal from the power output. The systems and methods cross-correlate the perturbation current signal with the voltage signal to provide a cross-correlation signal, and determine an island condition based upon the cross-correlation signal.

19 Claims, 10 Drawing Sheets

(56) References Cited

U.S. PATENT DOCUMENTS

| | | | |
|---|---|---|---|
| 2003/0147191 A1 | 8/2003 | Deng et al. | |
| 2005/0254191 A1 | 11/2005 | Bashaw et al. | |
| 2007/0143044 A1* | 6/2007 | Huang | H02J 3/38 |
| | | | 702/60 |
| 2008/0100145 A1* | 5/2008 | Ito | H02J 3/38 |
| | | | 307/125 |
| 2008/0179966 A1* | 7/2008 | Horio | H02J 3/38 |
| | | | 307/126 |
| 2009/0059631 A1* | 3/2009 | Krein | H02M 1/32 |
| | | | 363/95 |
| 2011/0004324 A1* | 1/2011 | Bickel | G01D 4/002 |
| | | | 700/3 |
| 2011/0058398 A1* | 3/2011 | Agbossou | H02J 3/383 |
| | | | 363/74 |
| 2011/0187200 A1* | 8/2011 | Yin | H02J 3/383 |
| | | | 307/86 |
| 2011/0309684 A1* | 12/2011 | Song | H02J 3/00 |
| | | | 307/87 |
| 2011/0309690 A1 | 12/2011 | West | |
| 2012/0013376 A1* | 1/2012 | Thacker | H03L 7/085 |
| | | | 327/156 |
| 2013/0258730 A1* | 10/2013 | Sato | H02M 1/4225 |
| | | | 363/78 |
| 2013/0301177 A1* | 11/2013 | Wagoner | H02J 3/38 |
| | | | 361/91.1 |
| 2014/0098449 A1* | 4/2014 | Hellberg | G01R 31/28 |
| | | | 361/78 |
| 2014/0103724 A1* | 4/2014 | Wagoner | H02M 7/797 |
| | | | 307/44 |
| 2014/0152331 A1* | 6/2014 | Wagoner | G01R 27/16 |
| | | | 324/705 |
| 2014/0210282 A1* | 7/2014 | Dong | H03L 7/08 |
| | | | 307/151 |
| 2014/0247632 A1* | 9/2014 | Phadke | H02J 3/381 |
| | | | 363/95 |
| 2014/0306533 A1* | 10/2014 | Paquin | H02J 3/383 |
| | | | 307/52 |
| 2015/0051749 A1 | 2/2015 | Hancock et al. | |
| 2015/0249416 A1* | 9/2015 | Barker | H02H 7/067 |
| | | | 290/44 |
| 2016/0124031 A1* | 5/2016 | Morsi Ibrahim | G01R 19/2513 |
| | | | 702/58 |
| 2017/0179720 A1* | 6/2017 | Porter | H02J 3/16 |
| 2019/0178923 A1* | 6/2019 | Shao | H02J 3/38 |

OTHER PUBLICATIONS

Notification of Transmittal of the International Search Report and the Written Opinion of the International Searching Authority from corresponding PCT/US2018/035022 dated Aug. 21, 2018.

Liu, Fangrui et al., "An Active Islanding Detection Method for Grid-Connected Converters," Project Supported by Delta Science & Technology Educational Development Program (DREK200501), 978-1-4244-1718-6, 2008, IEEE, pp. 734-737.

Yin, Jun et al., "A New Adaptive Logic Phase-Shift Algorithm for Anti-Islanding Protections In Inverter-Based DG Systems," 0-7803-9033-4, 2005, IEEE, pp. 2482-2486.

Yin, Jun et al., "A New Hybrid Anti-Islanding Algorithm in Grid Connected Three-Phase Inverter System," BNSDOCID, Jun. 18, 2006, pp. 1-7.

* cited by examiner

SYSTEMS AND METHODS FOR ISLANDING DETECTION

CROSS-REFERENCE TO RELATED APPLICATION

This application claims priority under 35 U.S.C. § 119(e) to U.S. Provisional Application Ser. No. 62/513,187, entitled "SYSTEMS AND METHODS FOR ISLANDING DETECTION," and filed on May 31, 2017, which is herein incorporated by reference in its entirety.

BACKGROUND OF INVENTION

Field of the Invention

At least one example in accordance with the present invention relates generally to providing power to loads and to a utility grid, and more particularly to detecting an islanding condition in which the utility grid has become unavailable, e.g., due to disconnection or malfunction.

Discussion of Related Art

Solar and other renewable energy sources are becoming increasingly prevalent for many applications and are often coupled to a public or other utility grid to provide power to the electric grid. Islanding in an electrical utility system is a condition in which a portion of the system that includes a load and power generation, such as a solar system with an inverter, is isolated from the remainder of the utility system due to a failure, a disconnection, or the like.

Some electrical systems detect an islanding condition, and, when detected, stop producing power in the isolated portion of the system. This is known as anti-islanding. Anti-islanding is desirable because islanding can have undesirable consequences, including hazards for utility line-workers, or the public, who may be unaware that a line remains energized even though it has been disconnected from the utility grid, and possible damage to customer equipment because the voltage and frequency on the islanded portion of the system is no longer controlled by the utility grid. For these reasons, islanding detection capability can be particularly desirable in systems where distributed devices supplying electrical power are connected to a utility grid.

SUMMARY

Aspects and embodiments are generally directed to systems and methods of islanding detection by, for example, power generation, storage, and distribution systems, including generators, photovoltaic (solar) cells, wind turbines, and the like, and inverters and power converters for any of these.

According to one aspect, an electric power system is provided. The electric power system includes a power input configured to receive input power, a power output configured to couple to an electric utility grid and to provide output power to the electric utility grid, power conversion circuitry coupled to the power input and the power output and configured to convert the input power into the output power, and island detection circuitry coupled to the power output and the power conversion circuitry. The island detection circuitry is configured to inject a perturbation current at the power output based upon a perturbation current signal, receive a voltage signal from the power output, cross-correlate the perturbation current signal with the voltage signal to provide a cross-correlation signal, and determine an island condition based upon the cross-correlation signal.

In some examples, the island detection circuitry is further configured to integrate the cross-correlation signal over a period of time to provide an integrated cross-correlation value, and wherein determining an island condition based upon the cross-correlation signal includes determining the island condition based upon the integrated cross-correlation value.

In some examples, determining an island condition based upon the cross-correlation signal includes comparing the cross-correlation signal to a threshold value. In certain examples, the island detection circuitry is further configured to adjust the threshold value.

Some examples include a power source coupled to the power input and configured to provide the input power. In certain examples, the power source includes a photovoltaic cell.

In some examples, the voltage signal is a quadrature voltage signal.

According to another aspect, a method is provided for detecting an islanding condition in an electric system that provides output power in the form of an output voltage and an output current. The method includes providing a perturbation current signal that causes a perturbation current to be injected into the output current, receiving a voltage signal related to the output voltage, cross-correlating the perturbation current signal with the voltage signal to provide a cross-correlation signal, and determining an islanding condition based at least in part upon the cross-correlation signal.

Some examples include integrating the cross-correlation signal to provide an integrated cross-correlation signal.

In certain examples, determining an islanding condition based at least in part upon the cross-correlation signal includes comparing a value of the cross-correlation signal to a threshold value. Some examples include adjusting the threshold value in response to a determination that the islanding condition does not exist.

In some examples, determining an islanding condition based at least in part upon the cross-correlation signal includes determining the islanding condition based upon a plurality of comparisons in which the cross-correlation signal value exceeds the threshold value.

Some examples include ceasing to provide output power in response to a determination that the islanding condition exists.

Some examples include hi-pass filtering the voltage signal.

In some examples the voltage signal is a positive sequence quadrature voltage signal.

Some examples include deriving the voltage signal by converting the output voltage, converting the output voltage including at least transforming the output voltage into 2-phase voltage signals and transforming the 2-phase voltage signals into a rotating reference frame to provide a direct voltage signal and a quadrature voltage signal.

According to some examples, a peak amplitude of the perturbation current is in a range of 1% to 3% of an active current of the output power.

According to another aspect, a method is provided for detecting an islanding condition in an electric system having a power output. The method including injecting a perturbation current at the power output, receiving a voltage signal related to an output voltage, processing the voltage signal to provide a processed value, comparing the processed value to a threshold value, determining an islanding condition based at least in part upon the comparison, and adjusting the threshold value.

In certain examples, processing the voltage signal to provide a processed value includes cross-correlating the voltage signal with a current signal to provide a cross-correlation signal, the current signal being related to the perturbation current, and integrating the cross-correlation signal over a period of time to provide an integrated cross-correlation value from which the processed value is derived.

In some examples, adjusting the threshold value includes adjusting the threshold value to a value greater than a weighted average of prior processed values.

Still other aspects, embodiments, examples, and advantages of these exemplary aspects and embodiments are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Systems and methods discussed herein are directed to electric power systems and methods for integration with an electric grid of a public or other utility. The example systems and methods discussed herein accept power input from various types of energy sources, convert power into single phase or three phase alternating current (AC), and provide power to a utility grid and various loads. The example systems and methods provide improved capability to detect an islanding condition, occurring when a utility grid is disconnected or malfunctioning, so that various systems or components may take action in response thereto, such as by shutting down.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Active methods of detecting islanding may include introducing intentional changes, disturbances, or perturbations to the connected grid, and monitoring the response to determine if the utility grid is still connected, by checking frequency, voltage, impedance, or other characteristics. Some examples include measuring or detecting impedances (perhaps at a particular harmonic frequency); attempting to cause, measure, and/or detect frequency shifts, drifts, or jumps; injecting current variations and detecting and/or measuring voltage responses; and attempting to vary voltages and detecting and/or measuring responses.

In conventional methods of detecting islanding, an electric system may inject a large perturbation signal into the utility grid. In some instances, the large perturbation signal may have adverse consequences for the electric system or the utility grid. In some cases, the electric system implements one or more feedback loops that increase the size of the injected signal when the electric system determines that islanding may be occurring, thereby increasing the size of disturbance and potentially adversely affecting the grid and/or connected loads. Another disadvantage of former approaches is that they typically have an undesirably large non-detection zone (NDZ), namely a specific set of operating conditions under which islanding detection is difficult or simply not possible. For example, the NDZ may include a range of local loads (i.e., loads within the island) for which a method can fail to detect islanding. For example, an RLC load with a high value of the quality factor (Q) can make islanding detection difficult. Also, an unbalanced RLC load can increase the difficulty of detection within a desired timeframe.

Figure 1:
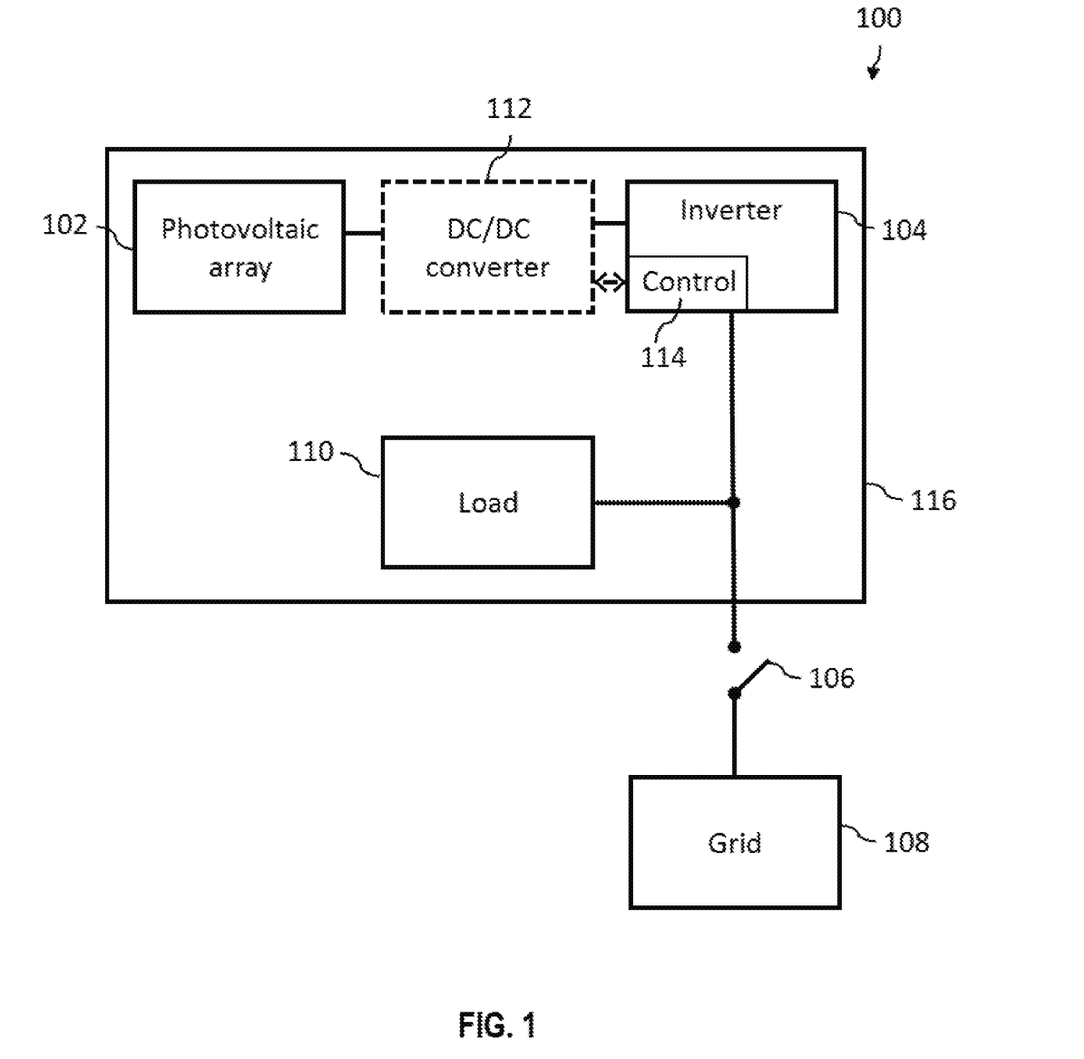
FIG. 1 is a block diagram of an example power provisioning system.

FIG. 1 is a block diagram illustrating an example system 100 in which islanding can occur. System 100 includes a photovoltaic array 102, an inverter 104, a circuit breaker 106, an electric utility grid 108, and a local load 110. System 100 may optionally include a DC/DC converter 112. The photovoltaic array 102 and the inverter 104 form a power generation system that provides power to the local load 110 and to the utility grid 108. The system 100 also includes a controller 114, which may be integrated with the inverter 104, or in other examples may be separate from the inverter 104. If the utility grid 108 is or becomes disconnected, such as illustrated by the circuit breaker 106 being open, an island 116 is created.

In various examples of the system 100, energy sources instead of or in addition to the photovoltaic array 102 may be included, such as wind generators, fuel-driven generators, other generators, batteries, fuel cells, etc., each of which may provide power to an inverter 104, or other form of power converter, for provision to loads and the utility grid 108. Additionally, each or multiple of such energy sources may be connected through a DC/DC converter, power conditioning modules, and/or power factor correction (PFC) circuits or components. Each or multiple of such energy sources may also include maximum power point tracking (MPPT) components or other power monitoring, conditioning, converting, balancing, and/or power controlling components. The inverter 104 may be any of various types of inverters, or may be other types of converters, capable of accepting power from at least one of any of the various energy sources and whose power output is intended to be compatible with the load 110 and the utility grid 108.

Figure 2A:
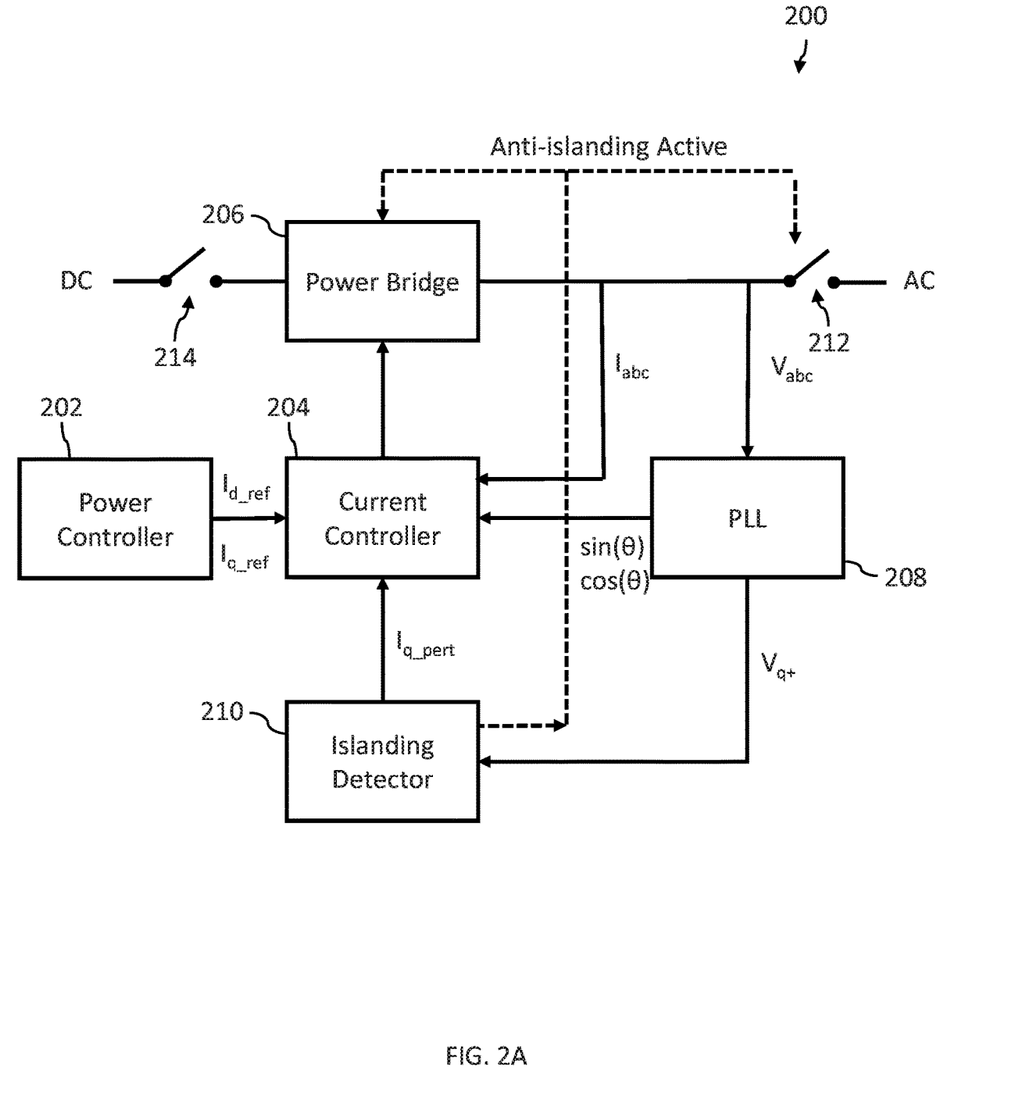
FIG. 2A is a block diagram of an example control block for a portion of a power provisioning system.

Various power adapting, converting, and/or inverting components may include control systems or components as part of their overall operation. FIG. 2A is a block diagram of an example inverter control block 200 that includes islanding detection. The inverter control block 200 includes a power controller 202 and a current controller 204 coupled to a power bridge 206 for the conversion and provision of AC power from a DC source. The AC output is monitored, via feedback, by the current controller 204, and angular phase information is provided to the current controller 204 by a Phase-Locked Loop (PLL) 208. An islanding detector 210 is included that injects a perturbing quadrature current, $I_{q\_pert}$, into the AC output and monitors a reaction in a positive sequence quadrature voltage, $V_{q+}$, which is also provided by the PLL 208. Switches 212 and 214 allow the AC and DC sides of the power bridge 206 to be disconnected, when necessary. As indicated by the dashed line, the power bridge 206 may be shut down and disconnected from the AC grid via the switch 212 when islanding is detected by the islanding detector 210.

The islanding detector 210 controls a perturbation current, which is injected as a quadrature perturbation via the current controller 204. The perturbation current may be injected at intervals and/or periods to provide substantially continuous monitoring for an islanding condition. The islanding detector 210 also monitors any resulting variation in a positive sequence quadrature voltage, caused by the perturbation current. A quadrature voltage, such as the positive sequence quadrature voltage, $V_{q+}$, indicates a reactive component of power being delivered to the loads in the electric system. Under steady-state conditions, the positive sequence quadrature voltage, $V_{q+}$, is a constant DC voltage, and may be zero volts if the net impedance of the loads in the system is purely resistive. If the utility grid 108 is connected and functioning normally, the overall system absorbs the perturbation current without causing any substantial variation in quadrature voltage. During an islanding condition, however, where the utility is disconnected, an injected quadrature current will cause a more substantial quadrature voltage to be generated. The PLL 208 measures voltages at the AC output side of the power bridge 206, and determines and provides the quadrature voltage to the islanding detector 210.

Figure 2B:
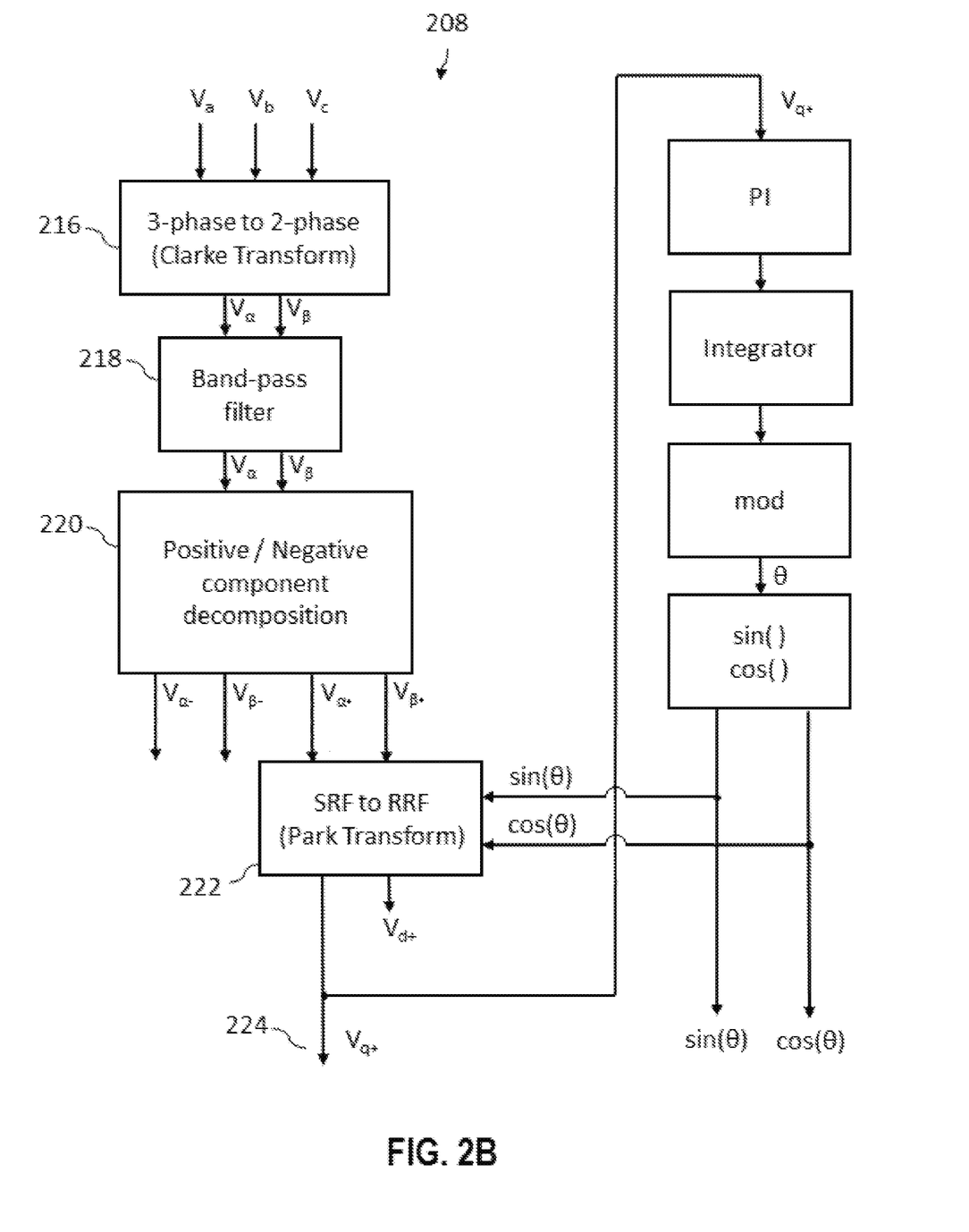
FIG. 2B is a block diagram of an example phase locked loop for a power system.

FIG. 2B is a block diagram illustrating an example implementation of the PLL 208, which, as part of its operation, generates a positive sequence quadrature voltage used as input to islanding detector 210 of FIG. 2A. The PLL 208 includes and/or performs a Clarke transform 216 that converts the three-phase AC voltages into two-phase voltage signals. The three-phase AC voltages input to the Clarke transform 216 are the AC output voltages from the power bridge 206 that are provided to the load 110 and the utility grid 108 when connected. The two-phase voltage signals may be filtered, e.g., to reduce noise. For example, a band-pass filter 218 may be configured to pass signals centered in about the 50-60 Hz range.

The two-phase voltage signals are decomposed into positive and negative sequence components by a further transform 220, and the positive sequence components are transformed from a stationary reference frame (SRF) to a rotating reference frame (RRF) by a Park transform 222, to generate positive sequence direct and quadrature voltages. The positive sequence quadrature voltage 224 is provided as an input to islanding detector 210 of FIG. 2A, the operation of which is described in more detail below. The PLL 208 includes additional components not described but shown in FIG. 2B for tracking, e.g., phase angles, that may be provided to the current controller 204 and may be used by the Park transform 222.

Figure 2C:
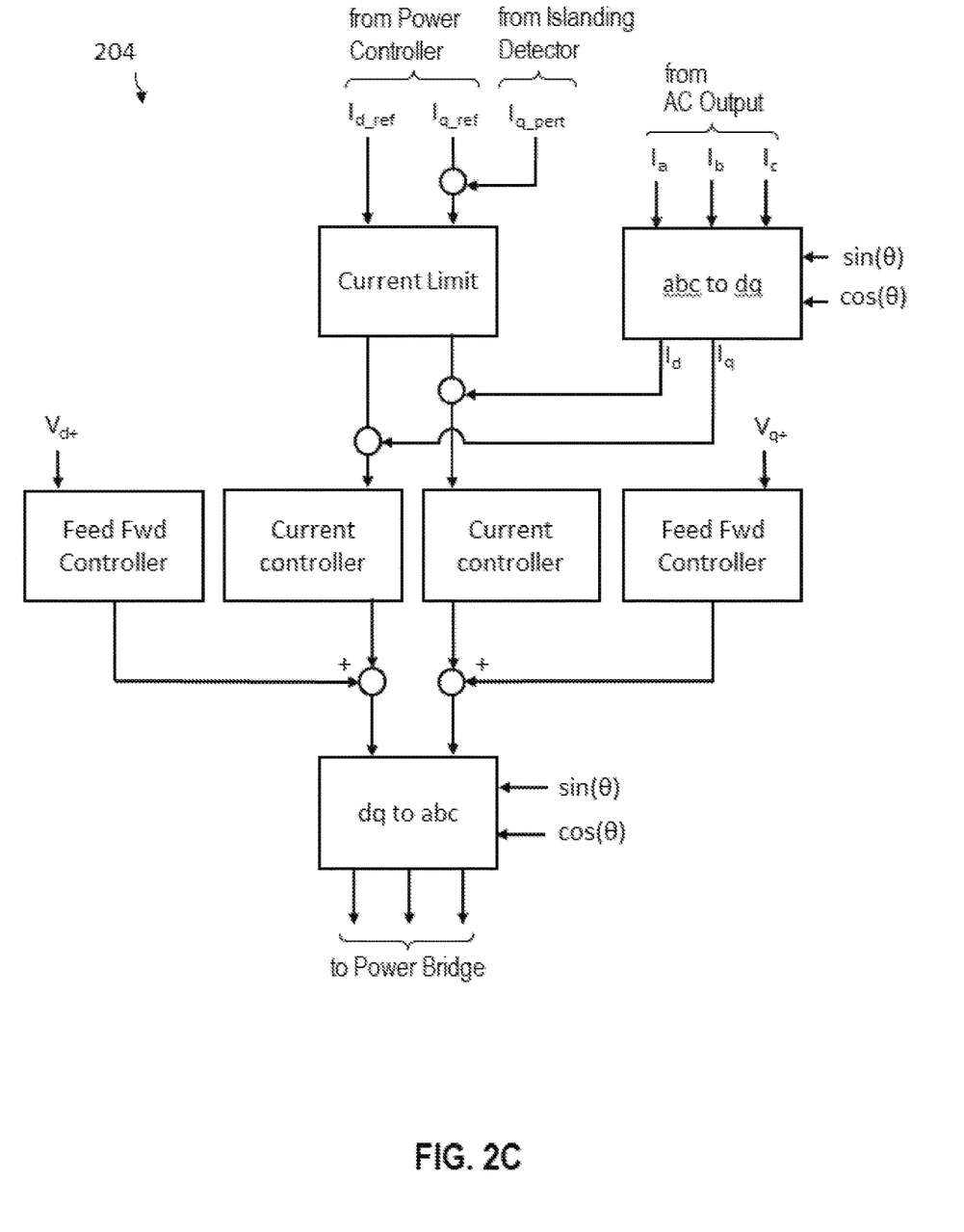
FIG. 2C is a block diagram of an example current controller for a power system.

FIG. 2C is a block diagram illustrating an example implementation of the current controller 204 of FIG. 2A. The current controller 204 receives direct and quadrature reference current values from the power controller 202, and receives a quadrature perturbation current value from the islanding detector 210 to provide output signals to control the power bridge 206. The current controller 204 illustrated in FIG. 2C is merely one example and may be implemented in various ways.

In the example control block 200 of FIG. 2A, the current controller 204 controls the power bridge 206 to inject a perturbation current into the reactive (quadrature) current at the AC output. The amount of perturbation current is controlled by a perturbation signal from the islanding detector 210. The perturbation current does not substantially affect the voltage of the grid when the grid is connected, i.e., there is minimal effect of injecting a perturbation current when the grid is functioning normally. The perturbation current is provided as a reactive current at least in part because changes to active power may have adverse effects on customer loads and may be more difficult to achieve given the power available and/or limitations of other components in the system, such as maximum power point tracking components.

Figure 2D:
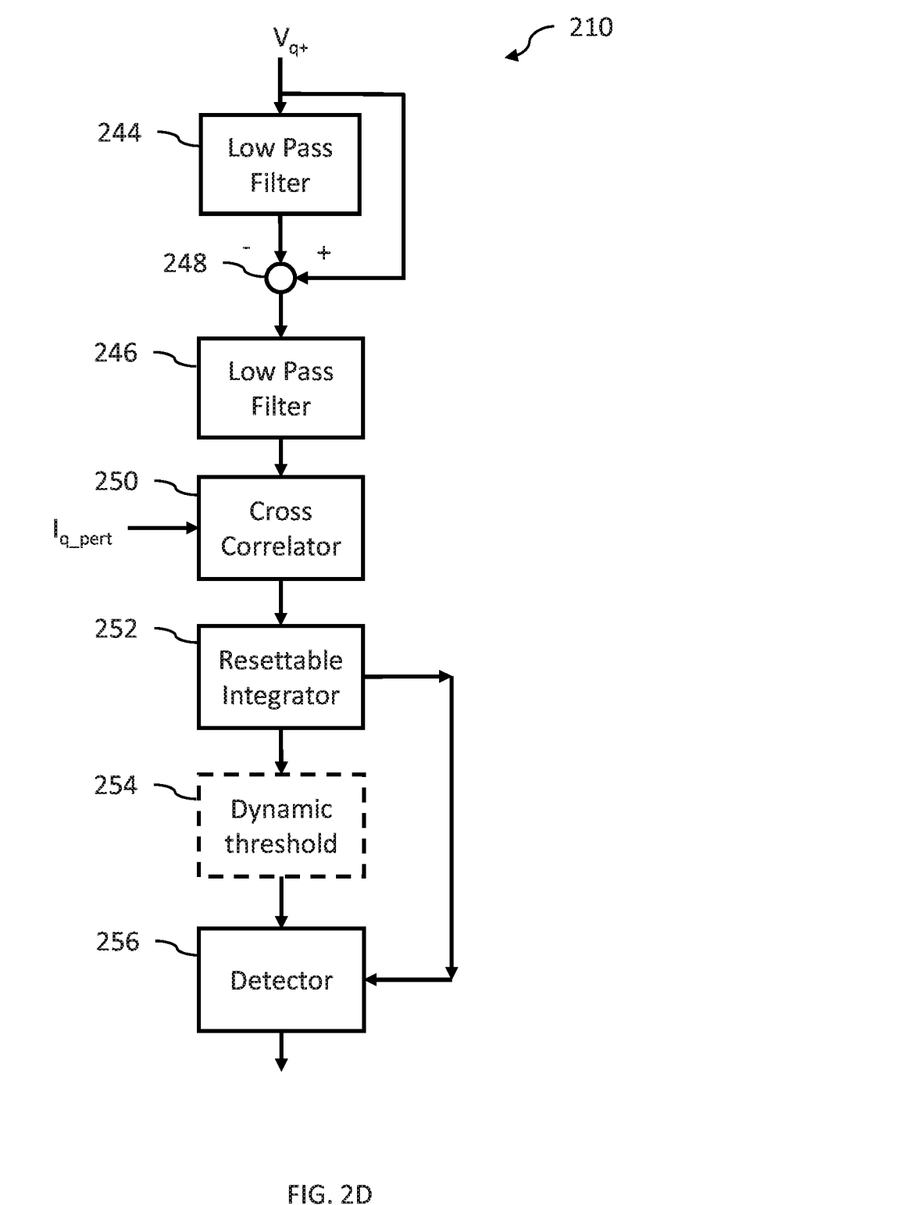
FIG. 2D is a block diagram of an example islanding detector for a power system.

FIG. 2D is a block diagram illustrating an example implementation of a portion of the islanding detector 210 of FIG. 2A. The islanding detector 210 includes low-pass filters 244 and 246, a subtractor 248, a cross-correlator 250, a resettable integrator 252, a dynamic threshold calculator 254, and a detector 256.

As discussed above, in a steady-state condition, the positive sequence quadrature voltage 224 is a DC signal. A perturbation current injected at the AC output of the power bridge 206, as discussed above, causes variation in the positive sequence quadrature voltage 224. The resulting variation in the positive sequence quadrature voltage 224 may be insubstantial when the grid is connected and operating normally, but the variation may be more substantial when an islanding condition exists. Additionally, the resulting variation in the positive sequence quadrature voltage 224 is correlated to the perturbation signal, $I_{q\_pert}$, which controls the injected perturbation current. Accordingly, the islanding detector 210 correlates the perturbation signal, $I_{q\_pert}$, and the resulting positive sequence quadrature voltage 224, $V_{q+}$, and analyzes the result (e.g., including integration and threshold detection) to determine whether an islanding condition exists.

First, the positive sequence quadrature voltage 224, provided by the PLL 208, is filtered to remove average and slow moving components, such as the steady-state DC value and ordinary fluctuations caused by variations in the utility grid and/or load conditions. In the example implementation shown in FIG. 2D, the slow moving components are filtered out by subtracting an output of the low-pass filter 244 from the unfiltered positive sequence quadrature voltage 224, by the subtractor 248. Subtracting a low-pass filtered version of a signal from itself is substantially the same as high-pass filtering the signal, and such may be achieved in various alternate manners. Higher frequency variations in the positive sequence quadrature voltage 224, such as harmonics, noise, and variations caused by more drastic changes in the utility grid and/or load conditions, are removed by the low pass filter 246. A net result of the low pass filters 244, 246 and the subtractor 248 is a band-pass filtered version of the positive sequence quadrature voltage 224, e.g., having removed steady-state and slow moving components as well as harmonics, noise, and other high frequency components. Filtering out such components reduces sensitivity to erroneous signal excursions and noise on the grid voltage signal, and reduces the likelihood of false detection of an islanding condition.

The filtered version of the positive sequence quadrature voltage 224 is cross-correlated with the perturbation signal, $I_{q\_pert}$, by the cross-correlator 250, and the integrator 252 integrates the output of the cross-correlator 250 over a period of time. The output of the integrator 252 is an integrated cross-correlation value. The integrated cross-correlation value is provided to a detector 256 that compares the integrated cross-correlation value to a threshold value to determine whether an islanding condition exists. For example, an integrated cross-correlation value that is higher than the threshold value may indicate that the positive sequence quadrature voltage 224 had a substantial response to the injected perturbation signal, which may indicate that an islanding condition exists.

The perturbation signal may be provided, and a perturbation current injected, at regular intervals. The integrator 252 is reset for each period of time, e.g., at the end of each perturbation interval, and a new integrated cross-correlation value is provided at the next interval. Accordingly, the islanding detector 210 may operate continuously and the integrator 252 may provide periodic integrated cross-correlation values to the detector 256 that periodically compares the current integrated cross-correlation value to a threshold to determine whether an islanding condition is indicated.

The threshold value to which the integrated cross-correlation value is compared, i.e., by the detector 256, may be a dynamic threshold. For example, the output of the integrator 252 may be provided to a dynamic threshold calculator 254 that calculates, or establishes, a dynamic threshold based upon previous values of the output of the integrator 252. Repetitive similar values of the integrated cross-correlation value over time may provide a reference value for normal conditions, and therefore may be the basis of a dynamic threshold value for islanding detection. Using a dynamic threshold, rather than a static threshold, reduces sensitivity of the systems and methods disclosed herein to various or changing grid impedances and conditions.

Figure 3:
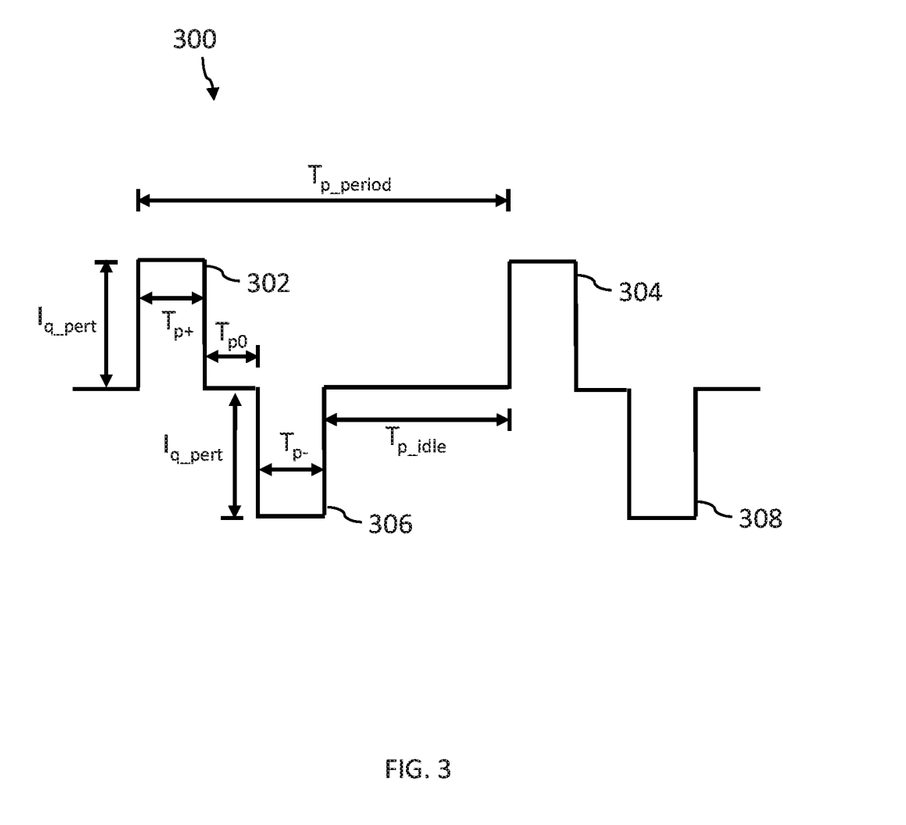
FIG. 3 is a graph of an example perturbation signal for injecting into a power system.

FIG. 3 is a schematic diagram illustrating an example perturbation signal 300. The perturbation signal 300 is a periodic full-wave square wave including positive-going portions 302 and 304 and negative-going portions 306 and 308, and is injected as a reactive current as discussed above. The magnitude of the perturbation signal 300 may be a fraction of the nominal current provided by the power bridge 206, and may be in a range of 0.5% to 10% or more of the nominal current. In certain examples, the magnitude of the perturbation signal 300 may be in the range of 1% to 3% of the nominal current. In an example implementation, the system includes two bridges, the nominal current is 2,000 amps (A) (rms), and the peak value for the injected perturbation signal is in the range 28A to 85A for two bridges (half for each of the two bridges). In other implementations, the inverter has only one bridge, and in yet other implementations, the inverter may have more than two bridges. The inverter may be rated for higher or lower current output than the example implementation above.

In one example, a power generation system includes 2 DC-to-AC inverters (or "power conversion bridges"), each rated for up to 1 MW (as 2 MW of power cannot be handled by a single inverter). Each inverter produces a 3-phase output. The two bridges are connected in parallel and the 3-phase outputs of the 2 bridges are interleaved (e.g., 180 degrees out of phase relative to each other). A default perturbation amplitude of 28A (peak) can be used, and kept fixed for various $I_d$ and $I_q$ commands from the power controller.

Example typical values of parameters labeled in FIG. 3 for the perturbation signal 300 are as follows:

$T_{p+}=T_{p-}=0$ ms~100 ms, default: 20 ms $T_{p0}=0$ ms~100 ms, default: 40 ms $T_{p\_period}=0$ ms~5 s, default: 160 ms $T_{p\_idle}=T_{p\_period}-T_{p+}-T_{p-}-T_{p0}$ In various examples, the values of the above parameters may be tuned to provide detection of an islanding condition within a required time, and/or to minimize an amount of current distortion added to the inverter output. In an example implementation, the required time for detection may be 850 ms. A square wave with a higher amplitude and shorter period may be used to improve detection at the cost of adding more distortion to the output current waveform of the inverter.

The perturbation signal 300 is both positive and negative-going. In one example, the perturbation magnitude is about 2% of a nominal current associated with a power bridge. In some examples, there may be reactive current injected into the system for purposes other than islanding detection. Aspects and embodiments disclosed herein differentiate the consequences of islanding in part by having both positive-going and negative-going parts to the perturbation signal 300. In various examples, other forms of a perturbation signal may be used. For example, the perturbation signal may not be a square wave, may include multiple levels, may have an uneven distribution of positive-going and negative-going portions, may not be of equal magnitude in a positive-going portion as a negative-going portion, and/or may vary from the example perturbation signal in other ways.

Figure 5:
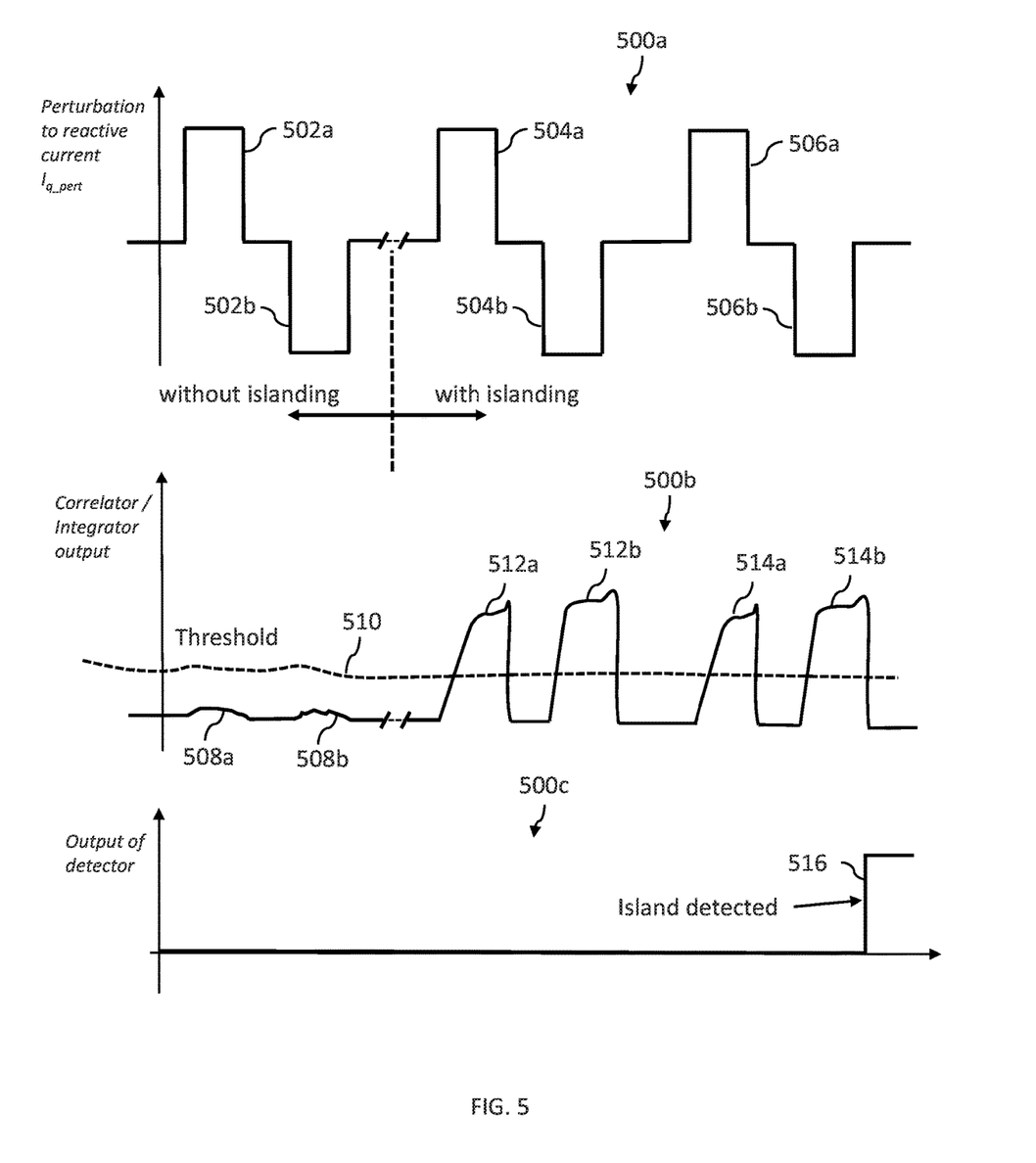
FIG. 5 is a set of signal graphs associated with an island detecting method.

In certain examples, detection of islanding requires multiple consecutive integrated cross-correlation values to exceed the threshold. In a particular example, four consecutive integrated cross-correlation values must exceed the threshold value, such as illustrated in FIG. 5, discussed below. A requirement of multiple consecutive values exceeding a threshold may provide more robust islanding detection, reducing or eliminating false positive detections.

Figure 4A:
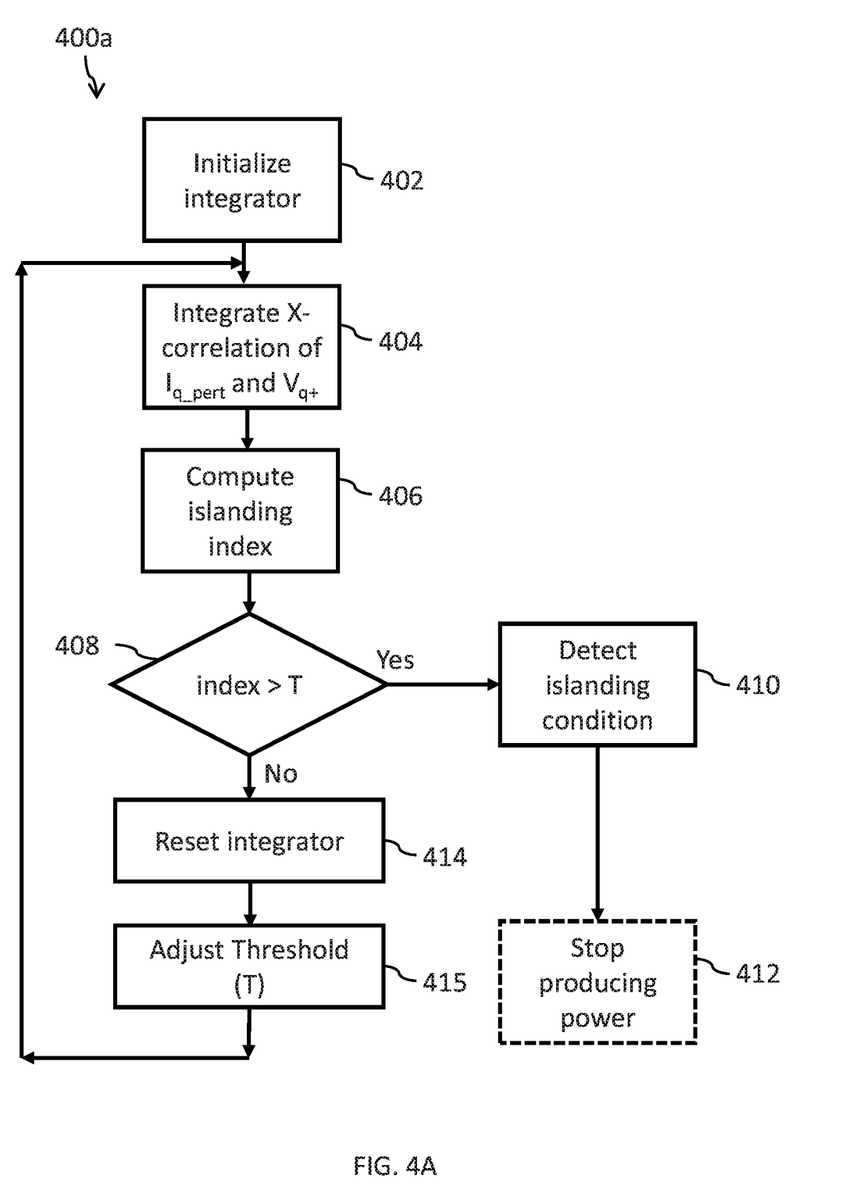
FIG. 4A is a flow diagram of an example of an island detecting method.

FIG. 4A is a flow chart illustrating an example method of operation 400a of aspects and embodiments disclosed herein for detecting an islanding condition. The method 400a may be implemented in the inverter control block 200 discussed above. An integrator is initialized at block 402. A perturbation current signal (injected into the reactive current) is cross-correlated with a quadrature voltage signal and the result is integrated (block 404). For example, the cross-correlator 250 and integrator 252 of the islanding detector 210 (see FIG. 2D) may perform the cross-correlation and integration of block 404. In some implementations, integration of the cross-correlation is performed over a single period of the periodic perturbation current signal. In other implementations, the integration is performed over more than one period of the perturbation current signal. Without islanding, the integrated output is low in response to the perturbation. With islanding, the integrated output is higher in response to the perturbation. Accordingly, if the integrated output exceeds a determined threshold then islanding is detected. The integrated output may be used to calculate an index (block 406) which is compared to the predetermined threshold (block 408) to determine whether islanding has occurred (block 410). In some examples, the integrated output (from block 404) may be directly compared to the threshold at block 408, rather than an index value. If an islanding condition is detected (block 410), an alert signal may be generated and provided to various outputs or other components, and power generation may be terminated (block 412). If an islanding condition is not detected, e.g., by the index or integrated value being less than the threshold (block 408), the integrator is reset (block 414) and the threshold may be adjusted (block 415) before beginning another integration (block 404).

In some examples, the quadrature voltage signal may be filtered before cross-correlation. In some examples, the quadrature voltage signal may be a positive sequence quadrature voltage signal. In other examples, the quadrature voltage signal may be a negative sequence quadrature voltage signal, or may be a quadrature voltage signal without separation into positive or negative components. In some examples, the perturbation current signal may represent a current signal injected into an active current component rather than a reactive current, and the voltage signal may be a direct voltage signal rather than a quadrature voltage signal.

The threshold T may be a dynamic threshold. In some examples, a new threshold value may be calculated from the integrated output, and if the absolute value of the new threshold value is less than the current threshold value, the threshold value is adjusted to be the new threshold value. In some examples, a new threshold value may be calculated using an exponential smoothing infinite impulse response (IIR) filter.

In some examples, a dynamic threshold value may be calculated as a percentage of or a percentage above a decaying average of historical integrated cross-correlation values, or may be a percentage of or above a decaying average of historical peak values of the cross-correlation (e.g., without integration). In certain examples, the dynamic threshold may be adjusted to be about 10% higher than a historical average of cross-correlation values during non-islanding times. In other examples, the dynamic threshold may be adjusted to as much as 200% of a historical non-islanding cross-correlation value.

Figure 4B:
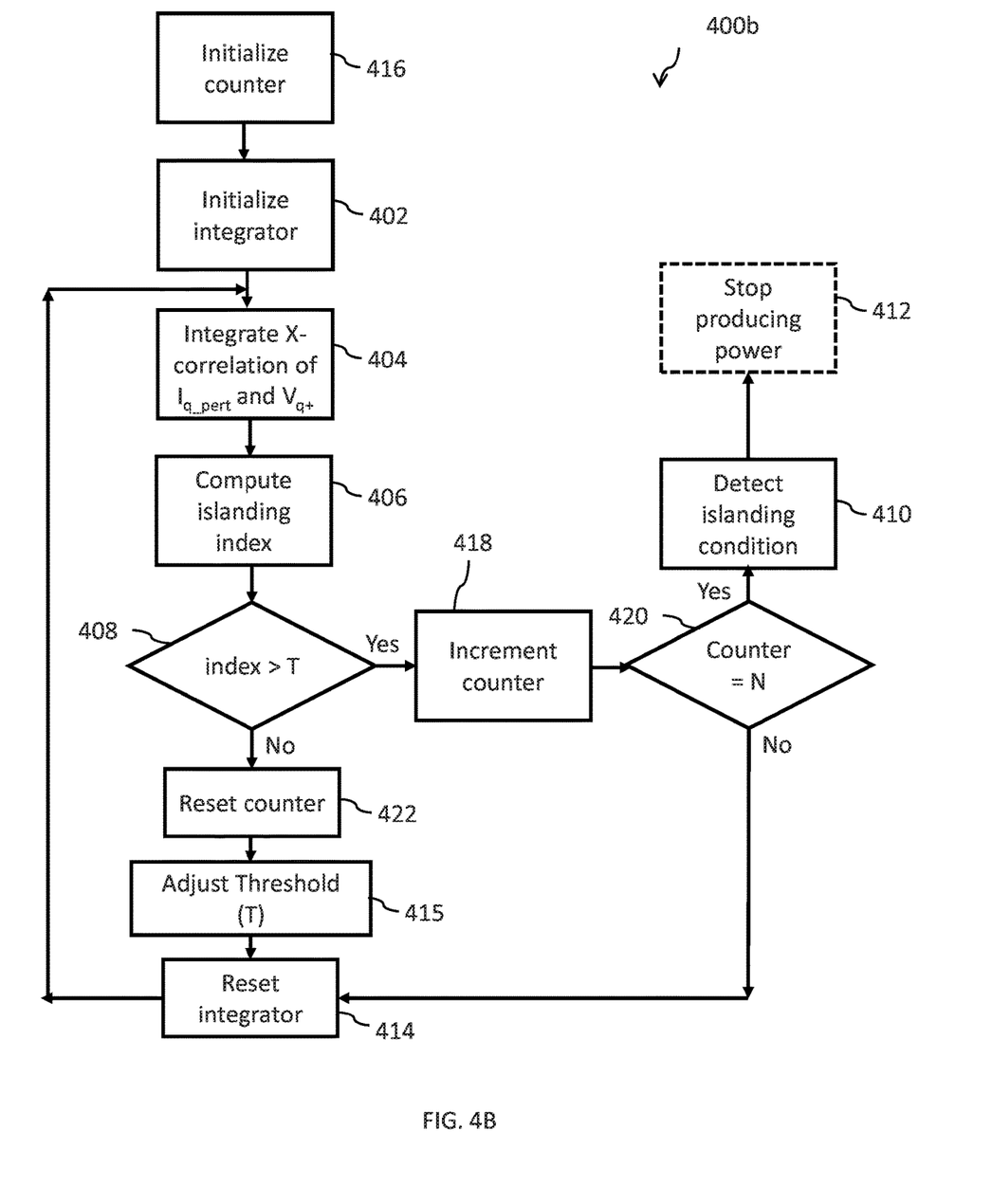
FIG. 4B is a flow diagram of another example of an island detecting method.

In certain examples, a single instance of exceeding the threshold (block 408) may not be considered sufficient to determine that an islanding condition exists (block 410). For example, FIG. 4B is a flow chart illustrating an example of an alternate method of operation 400b that includes detection of a number, N, of consecutive counts of the integrated output exceeding a threshold value. As described above, the number, N, may be four (4) in certain examples, but may be any number in accord with various system requirements such as detection times.

The method of operation 400b is similar to the method of operation 400a, and similar operations are labeled the same in FIG. 4B as in FIG. 4A. The method of operation 400b shown in FIG. 4B further includes a counter to track a number of times the integrated output exceeds the threshold (block 408). The counter is initialized (block 416) and subsequently incremented (block 418) and compared to a number, N, (block 420) when the integrated output exceeds the threshold, or reset (block 422) to zero when the integrated output doesn't exceed the threshold. If the counter reaches the established number, N, (block 420) which is the number of consecutive counts selected to trigger islanding detection, then an islanding condition is detected (block 410).

Islanding may be detected using systems and methods in accord with aspects and embodiments described herein. A square wave perturbation signal, cross-correlated with a quadrature voltage signal and integrated over the period of a single cycle of the perturbation signal, with and without islanding, is further illustrated in FIG. 5.

FIG. 5 shows a perturbation signal illustrated in the graph 500a and has positive-going and negative-going portions of a square wave. Positive-going portions include 502a, 504a, and 506a. Negative-going portions include 502b, 504b, and 506b. The graph 500a includes a time period without islanding and a time period with islanding. The time period without islanding includes positive-going portion 502a and negative-going portion 502b. The time period with islanding includes positive-going portions 504a and 506a, and negative-going portions 504b and 506b.

FIG. 5 also shows an integrated cross-correlation output illustrated in the graph 500b, which corresponds to the perturbation signal of graph 500a cross-correlated with a resulting quadrature voltage and integrated, as discussed above. The output in the graph 500b includes correlation peaks 508a and 508b corresponding to positive and negative-going portions 502a and 502b of perturbation signal during the time period without islanding. Graph 500b also shows that each of the correlation peaks 508a and 508b is below a predetermined threshold 510 indicated by a dashed line. The threshold 510 may be a dynamic threshold, as shown and as discussed above, that is varied and/or adjusted at, for example, any time the integrated output doesn't exceed the threshold.

Graph 500b also shows the output during the time period with islanding, and includes correlation peaks 512a and 512*b*, corresponding to positive and negative-going portions 504*a* and 504*b* of perturbation signal, and correlation peaks 514*a* and 514*b*, corresponding to positive and negative-going portions 506*a* and 506*b* of perturbation signal. Each of the correlation output peaks 512*a*, 512*b*, 514*a*, and 514*b* during the time period with islanding exceeds the threshold 510 for at least some portion of the integrated cross-correlation peak.

In the example shown in FIG. 5, the threshold 510 is exceeded for four (4) consecutive portions (half-waves) in the perturbation signal, which is the condition used in this example to trigger detection of islanding in the system. Accordingly, the graph 500*c* shows the output of a detector such as detector 256 of FIG. 2D, which indicates detection of islanding at the transition 516, after detecting the fourth consecutive correlation peak exceeding the threshold 510.

Various components disclosed herein, such as but not limited to the current controller 204, the PLL 208, the islanding detector 210, or others, may be implemented by software or firmware running on one or more processors, or may be implemented using a microcontroller, or may be implemented using an FPGA, or by other combinations of hardware, software, or firmware as part of a computing system.

Figure 6:
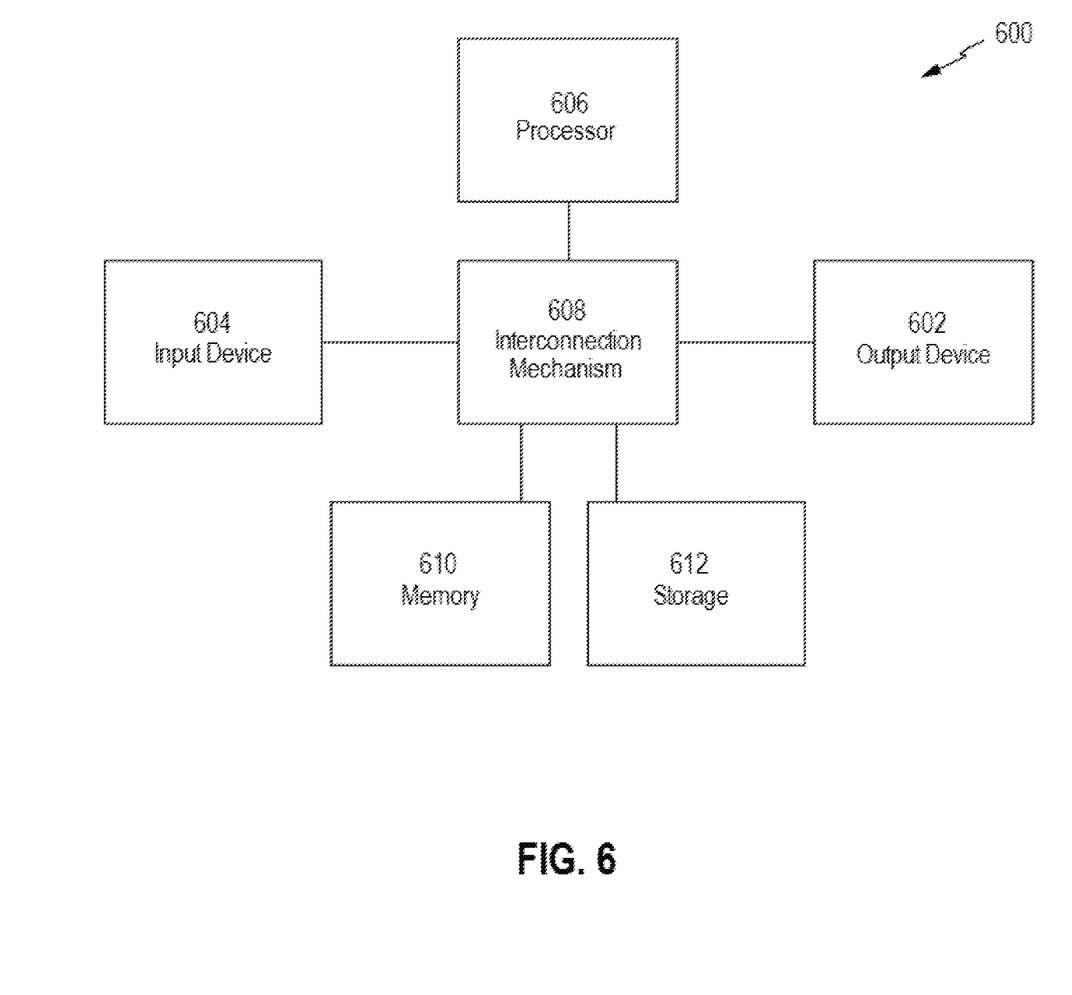
FIG. 6 is an example block diagram of computing components forming a system which may be configured to implement one or more aspects of the present invention.

FIG. 6 illustrates an example block diagram of computing components forming a computing system 600 which may be configured to implement one or more aspects disclosed herein. For example, the current controller 204, the PLL 208, the islanding detector 210, or similar may include a computing system 600, or a computing system 600 may be included to provide various functions of a control block 200, or to provide a management interface to an operator, or to communicate with other devices, such as a communications interface to a utility grid, a load, or energy source systems such as the photovoltaic array 102, for example.

The computing system 600 may include for example a computing platform such as those based on general computing processors, specialized processors, or microcontrollers. Computing system 600 may include specially-programmed, special-purpose hardware, for example, an application-specific integrated circuit (ASIC), or more generally designed hardware, such as a field programmable gate array (FPGA), microcontroller, or a general purpose processor. Additionally, various aspects of the present disclosure may be implemented as specialized software executing on a computing system 600 such as that shown in FIG. 6.

The computing system 600 may include a processor 606 connected to one or more memory devices 610, such as a disk drive, memory, flash memory, embedded or on-chip memory, or other device for storing data. Memory 610 may be used for storing programs and data during operation of the computing system 600. Components of the computing system 600 may be coupled by an interconnection mechanism 608, which may include one or more buses and/or a network. The interconnection mechanism 608 enables communications of, e.g., data and instructions, to be exchanged between components of the computing system 600. The computing system 600 may also include one or more input devices 604, which may include, for example, a keyboard, a mouse, a touch screen, and the like, or an interface capable of communicating with such devices. The computing system 600 may also include one or more output devices 602, which may include, for example, a display, a buzzer, alarm, or other audio indicator, a light, or other visual indicator, and the like, or an interface capable of communicating with such devices. In addition, the computing system 600 may contain one or more interfaces (not shown) that may connect the computing system 600 to a communication network.

The computing system 600 may include a storage component 612, which may include a computer readable and/or writeable nonvolatile medium in which signals may be stored to provide a program to be executed by the processor 606 or to provide information stored on or in the medium to be processed by the program. The medium may, for example, be a disk or flash memory or other non-volatile memory including programmable read-only memory (PROM) of various types, and in some examples, may include random access memory (RAM). In some embodiments, the processor may cause data to be read from the nonvolatile medium into another memory 610 that allows for faster access to the information by the processor 606 than does the medium. The memory 610 may be a volatile, random access memory such as a dynamic random access memory (DRAM) or static memory (SRAM). The processor 606 may manipulate the data within the memory 610 and copy the data to the storage 612 after processing is completed. Either or both of the memory 610 and storage 612 may be integrated in the processor 606.

The computing system 600 may include a computer platform that is programmable using a high-level computer programming language. The computing system 600 may also be implemented using specially programmed or special purpose hardware, e.g. an ASIC. The processor 606 may execute a core low-level operating system and may also execute a high-level operating system. Examples of high-level operating systems include Windows operating systems available from the Microsoft Corporation, MAC OS or iOS operating systems available from Apple Computer, Solaris Operating Systems available from Sun Microsystems, UNIX and/or LINUX operating systems available from various sources, and Android operating systems available from Google, Inc. Many other operating systems may be used, including bare metal and/or virtual computing systems.

In certain embodiments, an inverter has a controller that implements systems and methods in accord with aspects and embodiments disclosed herein. The controller may include a processor, which may be any of the above or other suitable processors, including ASICs, and may run an instruction set or operate upon other logic, to implement control of the inverter as discussed above.

Some embodiments of systems and methods in accord with the aspects and embodiments disclosed herein, may provide single phase power or three phase power, and may receive input power in single phase or three phase from any of various power inputs, or any combination thereof. Embodiments disclosed herein can provide power to critical loads and/or to a utility grid using multiple power sources, including energy storage, renewable energy sources, and non-renewable energy sources. Conventional and modern sources, and future energy sources, may be accommodated in various embodiments by various converters and/or power conditioning and control modules (PCCM) coupled to various inputs of an inverter or other converter.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An electric power system comprising:
a power input configured to receive input power;
a power output configured to couple to an electric utility grid and to provide output power to the electric utility grid;
power conversion circuitry coupled to the power input and the power output and configured to convert the input power into the output power; and
island detection circuitry coupled to the power output and the power conversion circuitry, the island detection circuitry configured to:
inject a perturbation current at the power output based upon a perturbation current signal;
receive a voltage signal from the power output;
cross-correlate the perturbation current signal with the voltage signal to provide a cross-correlation signal; and
determine an island condition based upon the cross-correlation signal.

2. The electric power system of claim 1 wherein the island detection circuitry is further configured to integrate the cross-correlation signal over a period of time to provide an integrated cross-correlation value, and wherein determining an island condition based upon the cross-correlation signal includes determining the island condition based upon the integrated cross-correlation value.

3. The electric power system of claim 1 wherein determining an island condition based upon the cross-correlation signal includes comparing the cross-correlation signal to a threshold value.

4. The electric power system of claim 3 wherein the island detection circuitry is further configured to adjust the threshold value.

5. The electric power system of claim 1 further comprising a power source coupled to the power input and configured to provide the input power.

6. The electric power system of claim 5 wherein the power source includes a photovoltaic cell.

7. The electric power system of claim 1 wherein the voltage signal is a quadrature voltage signal.

8. A method of detecting an islanding condition in an electric system that provides output power in the form of an output voltage and an output current, the method comprising:
providing a perturbation current signal that causes a perturbation current to be injected into the output current;
receiving a voltage signal related to the output voltage;
cross-correlating the perturbation current signal with the voltage signal to provide a cross-correlation signal; and
determining an islanding condition based at least in part upon the cross-correlation signal.

9. The method of claim 8 further comprising integrating the cross-correlation signal to provide an integrated cross-correlation signal.

10. The method of claim 8 wherein determining an islanding condition based at least in part upon the cross-correlation signal includes comparing a value of the cross-correlation signal to a threshold value.

11. The method of claim 10 further comprising adjusting the threshold value in response to a determination that the islanding condition does not exist.

12. The method of claim 10 wherein determining an islanding condition based at least in part upon the cross-correlation signal includes determining the islanding condition based upon a plurality of comparisons in which the cross-correlation signal value exceeds the threshold value.

13. The method of claim 8 further comprising ceasing to provide output power in response to a determination that the islanding condition exists.

14. The method of claim 8 further comprising hi-pass filtering the voltage signal.

15. The method of claim 8 wherein the voltage signal is a positive sequence quadrature voltage signal.

16. The method of claim 8 further comprising deriving the voltage signal by converting the output voltage, converting the output voltage including at least transforming the output voltage into 2-phase voltage signals and transforming the 2-phase voltage signals into a rotating reference frame to provide a direct voltage signal and a quadrature voltage signal.

17. The method of claim 8 wherein a peak amplitude of the perturbation current is in a range of 1% to 3% of an active current of the output power.

18. A method of detecting an islanding condition in an electric system having a power output, the method comprising:
injecting a perturbation current at the power output;
receiving a voltage signal related to an output voltage;
processing the voltage signal to provide a processed value;
comparing the processed value to a threshold value;
determining an islanding condition based at least in part upon the comparison; and
adjusting the threshold value;
wherein processing the voltage signal to provide a processed value includes cross-correlating the voltage signal with a current signal to provide a cross-correlation signal, the current signal being related to the perturbation current, and integrating the cross-correlation signal over a period of time to provide an integrated cross-correlation value from which the processed value is derived.

19. A method of detecting an islanding condition in an electric system having a power output, the method comprising:
injecting a perturbation current at the power output;
receiving a voltage signal related to an output voltage;
processing the voltage signal to provide a processed value;
comparing the processed value to a threshold value;
determining an islanding condition based at least in part upon the comparison; and
adjusting the threshold value;
wherein adjusting the threshold value includes adjusting the threshold value to a value greater than a weighted average of prior processed values.

* * * * *